United States Patent [19]

Houston et al.

[11] Patent Number: 5,015,882

[45] Date of Patent: May 14, 1991

[54] COMPOUND DOMINO CMOS CIRCUIT

[75] Inventors: Theodore W. Houston, Richardson; Patrick W. Bosshart, Dallas; Ching-Heo Shaw, Plano, all of Tex.

[73] Assignee: Texas Instruments Incorporated, Dallas, Tex.

[21] Appl. No.: 542,666

[22] Filed: Jun. 25, 1990

Related U.S. Application Data

[63] Continuation of Ser. No. 903,330, Sep. 3, 1986, abandoned.

[51] Int. Cl.[5] .......................................... H03K 19/017
[52] U.S. Cl. ................................. 307/452; 307/443; 307/481
[58] Field of Search ................. 307/443, 448, 451–453, 307/480–481, 353, 246, 577, 579, 584–585, 242, 269, 291

[56] References Cited

U.S. PATENT DOCUMENTS

| | | | |
|---|---|---|---|
| 3,651,342 | 3/1972 | Dingwall | 307/585 |
| 4,100,430 | 7/1978 | Lesser | 307/453 |
| 4,415,819 | 11/1983 | Mathes | 307/453 X |
| 4,570,084 | 2/1986 | Griffin et al. | 307/452 |

FOREIGN PATENT DOCUMENTS 2120033  11/1983  United Kingdom ................ 307/452

OTHER PUBLICATIONS

"Checking A Clocked Differential Cascode Logic", IBM T.D.B., vol. 28, No. 1 Jun. 1985, pp. 254–256.
Cole et al., "Dynamic Logic Circuit", IBM T.D.B., vol. 16, No. 2, Jul. 1973, p. 567.
Rhyne, *Fundamentals of Digital Systems Design*, Practice-Hall, Inc., N.J., 1973, pp. 69–77.
*IEEE Standard Dictionary of Electrical and Electronic Terms*, 3rd Ed. by IEEE, Inc., N.Y., 1984, pp. 149 & 502.

*Primary Examiner*—David Hudspeth
*Attorney, Agent, or Firm*—James C. Kesterson; James T. Comfort; Melvin Sharp

[57] ABSTRACT

A compound CMOS domino circuit is disclosed having a first input section (62) comprising input transistors (50, 52, 54) connected to a preliminary dynamic output node (66). A second input section (64) including input transistors (56, 58, 60) is connected to a preliminary output dynamic node (68) which is independent of the first dynamic node (66). Separate precharge devices (72, 74) precharge the respective dynamic nodes (66, 68) to a desired voltage. Separate discharge transistors (78, 80) operate in conjunction with the respective input sections (62, 64) to discharge the dynamic nodes (66, 68) A static output logic gate (70) includes inputs connected to the dynamic nodes (66, 68) and an output of the compound domino logic circuit.

8 Claims, 1 Drawing Sheet

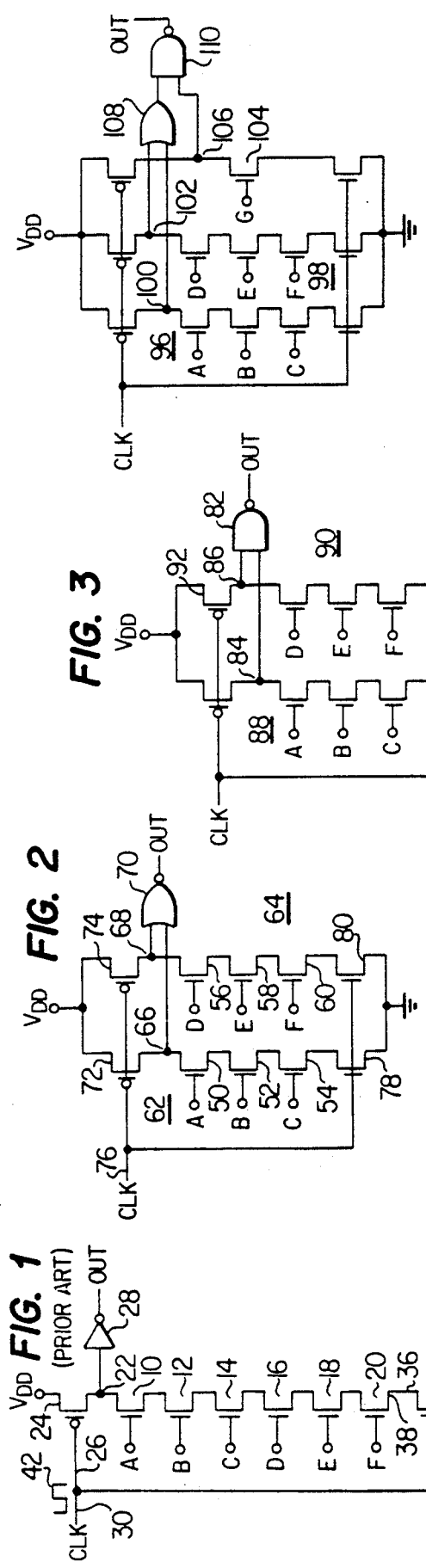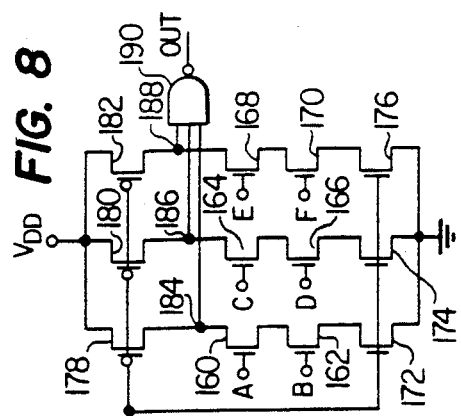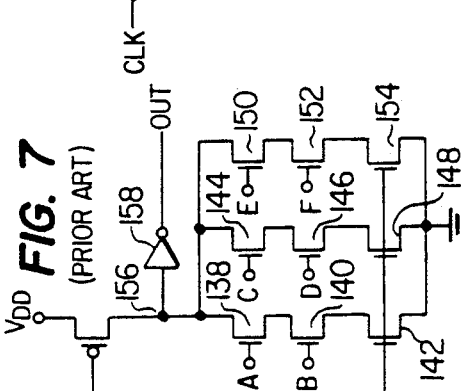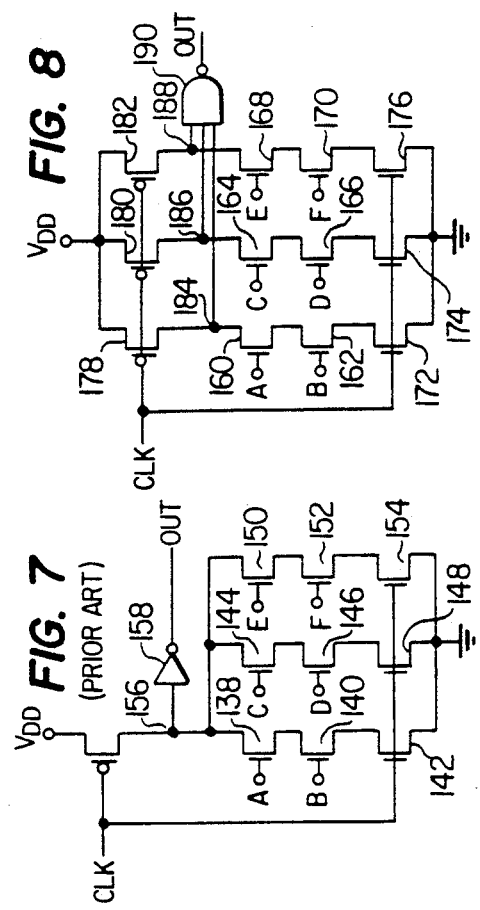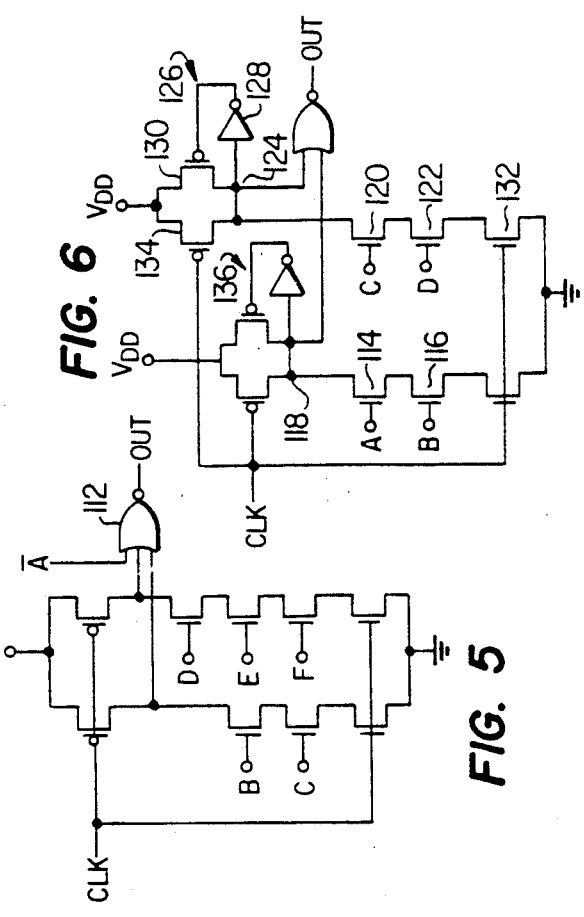

COMPOUND DOMINO CMOS CIRCUIT

This application is a continuation of application Ser. No. 903,330 filed Sept. 3, 1986, now abandoned.

TECHNICAL FIELD OF THE INVENTION

The present invention relates in general to semiconductor circuits, and more particularly relates to domino-type CMOS circuits.

BACKGROUND OF THE INVENTION

A well known technique for simplifying logic is to arrange a number of series-connected transistors together to simultaneously process digital signals and provide a single output node. The domino-type of logic circuits utilize this technique by cascading plural NMOS input devices to provide an AND logic function. A PMOS transistor is provided, and is clocked to precharge the output node to a predetermined logic state. Depending on the logic state of the inputs of the input devices, the output node remains at the precharged state, or is pulled low through the series-connected devices by a clocked NMOS device connected to ground. In accordance with the logic NAND function, if all of the NMOS input devices are driven by a logic high level, an output node of the domino circuit will be a logic low. Conversely, if any one of the input NMOS devices is driven with a logic low, the output node of the domino circuit will remain at its precharged logic high state. Because no inversion function is performed with this arrangement, an inverter is generally utilized at the output of the domino circuit to perform a logic inversion function so that an overall AND function is realized.

While the domino-type of logic circuit provides a speed advantage, as well as reduced wafer area, this logic family is susceptible to a severe drawback. Because the domino-type of logic is dynamic, i.e., relies on the sustained logic state by charging the parasitic capacitances of the output node, the finite charge precharged at the node must be distributed to each input NMOS device to charge the drain-source capacitance of each such device. When the number of cascaded NMOS input devices becomes large, a number of turned on input devices may cause the output node to become significantly discharged. When this occurs, the output of the inverter can change state, even though not all of the input NMOS devices have been driven into conduction. An erroneous logic output is thereby produced which is contrary to the logic AND function which specifies that an output is produced when all of the inputs are driven to the same logic high state.

The number of input devices, and thus the number of domino inputs, is thereby limited. This can be appreciated as the voltage drop at the circuit output node increases as more cascaded input NMOS devices are driven into conduction. The problem noted above exists when a number of NMOS devices adjacently connected to the output node are turned on, and one or more others are not. Of course, when all input NMOS devices are driven into conduction, the output node is driven to a logic low which satisfies the AND function.

From the foregoing, it can be seen that a need exists for an improved domino logic circuit which is free from the limitation of the number of input devices. Moreover, a concomitant need exists for an improved domino logic family which is yet even higher in speed, and which may be fabricated in a smaller wafer area.

SUMMARY OF THE INVENTION

In accordance with the present invention, the disclosed compound domino circuit reduces or eliminates the disadvantages and shortcomings associated with the prior art circuits. According to the compound domino logic, plural NMOS input transistors are split into multiple sections, each section providing a separate preliminary output node. Thus, each cascaded section processes respective input logic signals to produce independent preliminary outputs. While the NMOS input transistors of each section are cascaded, the sections themselves are arranged in parallel.

The preliminary output node of each section is connected to a static logic gate which logically combines the signals of the preliminary outputs to produce a circuit output according to the logic function desired.

Even though the number of inputs of the overall compound circuit remains the same, the compounded arrangement thereof effectively reduces the number of input transistor drain-source capacitances per output node which must be charged. In a conventional six-input domino circuit, ten drain-source capacitances must be serially charged, assuming the last input transistor in the cascaded chain is not driven into conduction. With a dual three-input cascaded and compounded arrangement of the invention, only four drain-source capacitances per section need be charged. In addition to compounding transistor sections to provide independent output nodes, each such node is separately precharged. A PMOS transistor is connected to each preliminary output node, and clocked to precharge the nodes to a logic high level.

Circuit simplification can also be realized by the use of the compound domino logic in that if the complement of an input signal is available, such signal can then be connected directly to the output inverting static logic circuit which is generally a multiple input gate. This allows an efficient utilization of available signals so that extra signal lines do not need to be run to wafer areas where they would otherwise not be needed.

The utilization of the present invention does not preclude the use of conventional feedback techniques to provide quasi-static operation at the precharged node.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the views, and in which;

FIG. 1 is a schematic diagram of a conventional six-input domino logic and circuit known in the art;

FIG. 2 is a compound domino logic circuit according to the invention, constructed to provide a logic AND function;

FIG. 3 is another embodiment of a compound domino logic circuit embodying a logical OR function;

FIG. 4 is another embodiment of the invention, illustrating a three-section compound domino circuit;

FIG. 5 is a schematic drawing illustrating the application of an input to the domino logic circuit directly to the static logic circuit of the compound domino circuit;

FIG. 6 illustrates the use of feedback in a compound domino logic circuit to achieve quasi-static operation;

FIG. 7 is a schematic drawing of a conventional six-input domino logic OR circuit known in the art; and FIG. 8 is a compound domino logic circuit according to the invention, constructed to provide a logic OR function.

DETAILED DESCRIPTION OF THE INVENTION

The operation of conventional CMOS domino circuits is better understood by referring first to FIG. 1. A conventional six-input CMOS domino circuit is shown with corresponding six input transistors 10-20. The input transistors 10-20 are generally N-channel (NMOS) enhancement mode devices, each associated with and connected to a respective input A-F. Thus, when a logic high is applied to any one of the circuit inputs A-F, the associated input transistor 10-20 is turned on, e.g., a conduction channel is formed between the source and drain terminal of the respective transistor. Each input transistor 10-20 is connected to the others in what is known as a cascaded arrangement.

An output indication of the conduction of all transistors 10-20 can be determined at node 22. Node 22 is also connected to a P-channel (PMOS) transistor 24 which is connected to a supply voltage Vdd. When the P-channel transistor 24 is driven into conduction, such as by a logic low voltage on the gate input 26, the supply voltage is coupled through the transistor 24 and is applied to the node 22. The node is thus precharged to a logic high voltage. According to the conventional operation of MOS circuits, when the precharge transistor 24 is turned off, the node 22 will remain precharged to the supply voltage until each transistor of the input transistor string 10-20 is driven into conduction. An inverter 28 is connected between node 22 and the output of the domino circuit for providing the complement of the signal appearing at such node.

In accordance with the conventional operation of CMOS domino circuits, a clock input 30 is connected to the gate 26 of precharge transistor 24, as well as to the gate 32 of an NMOS discharge transistor 34. The drain 36 of transistor 34 is connected to the source 38 of the bottom input transistor 20. The source 40 of transistor 34 is connected to ground. Thus, when a logic high is applied to the gate 32, transistor 34 is driven into conduction, thereby grounding the source 38 of input transistor 20.

In performing the logic AND function, the logic low, part of the precharge clock signal 42 is applied to the clock input 30. The PMOS precharge transistor 24 is driven into conduction, thereby precharging node 22 to a Vdd voltage level. During the low portion of the precharge clock 42, a discharge transistor 34 is nonconductive. During the logic high part of the precharge clock signal 42, the PMOS precharge transistor 24 is rendered nonconductive, and the NMOS discharge transistor 34 is made conductive. As noted above, the source of input transistor 20 is precharged to a logic low. It is during the logic high part of the precharge clock signal 42 that digital signals are applied to the domino circuit inputs A-F. In the event that six logic high signals are applied to the inputs A-F, the respective input transistors 10-20 as will be turned on and the conducting discharge transistor 34 will pull node 22 to a logic low. The inverter 28 inverts the logic low at node 22 and provides an output logic high to the circuit output. An AND logic function is thereby realized.

The CMOS domino circuit of FIG. 1 may be especially susceptible to a false output when, for example, inputs A-E are driven to logic high levels, while input F remains at a logic low level. In this situation, the AND logic function should not be realized as transistor F is nonconductive, and thus the discharge transistor 34, even though conductive, is electrically isolated from input transistor 18. However, with transistors 10-18 driven into conduction, the voltage with which node 22 is precharged functions as a source of voltage and begins charging the drain-source capacitances of each conducting transistor 10-18. Depending upon the amount of drain-source capacitance, and the number of series transistors conducting (five in the example), the voltage at node 22 can drop to such an extent that the inverter 28 switches the output of the circuit to a logic high. This, of course, is an erroneous output as not all of the inputs A-F have been driven to a logic high level. The present invention remedies this shortcoming and thus provides a more reliable circuit operation.

An improved CMOS compound domino circuit constructed in accordance with the invention is illustrated in FIG. 2. For purposes of illustration and comparison with the prior art, the CMOS domino circuit of FIG. 2 includes six inputs and provides a logical AND function. Departing from conventional practices, the inputs are separated into independent sections, with inputs A-C operating as a first section, and inputs D-F operating as a second section. Input transistors 50-54 are associated with the respective inputs A-C, while input transistors 56-60 are associated with inputs D-F. Transistors 50-54 comprise the first input transistor section or stage 62, while transistors 56-60 comprise the second input section 64.

The first and second input transistor sections 62 and 64 each include a respective preliminary output node 66 and 68 which operate independently of each other. The preliminary output nodes 66 and 68 are connected to the inputs of a static NOR gate 70. The output of the NOR gate 70 comprises the output of the compound domino circuit.

In order to insure the independent operation of input transistor sections 62 and 64, two PMOS precharge transistors 72 and 74 are connected between the supply voltage Vdd and the respective preliminary output nodes 66 and 68. Each gate input of the PMOS precharge transistors 72 and 74 is driven by a precharge clock input 76. The precharge clock (CLK) input 76 also drives the gates of a pair of NMOS transistors 78 and 80 which are connected between ground and the bottommost transistors 64 and 60 of the respective sections 62 and 64.

As can be seen from the compound domino circuit of FIG. 2, if input transistor 54 of the first section 62 is not conducting, the preliminary output node 66 must provide a charge capability for at most the two transistors 50 and 52. Similarly, if input transistor 60 associated with input F of the second input section 64 is nonconducting, the preliminary output node 68 must charge the drain-source capacitances of only the two input transistors 56 and 58. The charge sharing problem between drain-source capacitances for a given charge stored at the preliminary output nodes is thereby reduced. The erroneous output due to the excessive discharge of the circuit node is also eliminated, without reducing the total number of inputs to the logic circuit.

Not only is the reliability of the compound domino circuit improved, but the speed of the circuit can also be increased. By this it is meant that with fewer series transistors to turn on, the logic state of each section 62 and 64 can be established at the respective preliminary output node 66 and 68 faster.

The use of the compound logic circuit of FIG. 2 is similar to that of the prior art, in that a low clock signal is applied to the CLK input 76 to drive the precharge transistors 72 and 74 into conduction. The supply voltage Vdd thereby charges the preliminary output nodes 66 and 68 to a predetermined state. A precharge clock signal transition from a logic low to a logic high turns off precharge transistors 72 and 74, and drives discharge transistors 78 and 80 into conduction. A near ground voltage is thus applied to the source terminals of respective input transistors 54 and 60. During the application of the logic high precharge clock to the input 76, logic high signals applied to the first set of input transistors 50–54 will cause the preliminary node 66 to be driven to a logic low. If, on the other hand, any one of the inputs A-C is at a logic low, the preliminary output node 66 will remain at the precharged high level.

Although the input transistors 56–60 of the second section 64 operate independently of those of the first section 62, the logical operation is identical. Thus, during a true logic AND function where all the inputs A-F are at logic highs, the preliminary output nodes 66 and 68 will be driven to logic low levels. With two logic low signals applied to the NOR gate 70, the output of the domino circuit will be driven to a logic high level. A similar analysis can be conducted to understand that if any one input A-F remains at a logic low level, the output of the NOR gate 70 will remain at a logic low level. The compound logic circuit of FIG. 2 therefore provides an overall logic AND function.

While the various compound domino logic circuits disclosed herein are provided with a discharge transistor associated with each input section, such arrangement is not necessary to the principals of the invention. For example, a single discharge transistor could be connected to both input transistors 54 and 60 to provide a discharge path to ground to both input sections 62 and 64.

FIG. 3 illustrates a compound domino logic circuit which provides a logic function equivalent to a conventional dual three-input domino circuit having a common precharged node. A conventional practice in extending the number of inputs in prior domino circuits is to connect additional input transistor sections to the node 22 (FIG. 1). The charge sharing problems noted above are further aggravated by resort to this technique. FIG. 3 illustrates a compound domino circuit with a first input transistor section 88 associated with inputs A-C, and a second section 90 with associated inputs D-F. In the compound domino circuit of FIG. 3, the charge sharing problem is not exacerbated by the addition of a second section 90. This is because the preliminary output nodes 84 and 86 of the respective sections 88 and 90 are independently charged by respective precharge transistors. Thus, the additional drain-source capacitances added by the second input transistor section 90 do not share the charge of the preliminary output node 84 of the first section. Rather, a new preliminary output node 86 is formed to operate with the second input transistor section 90, together with a P-channel precharge transistor 92 and a discharge transistor 94. The logic function provided by the compound domino logic of FIG. 3, and the equivalent conventional common node domino circuit can be expressed as:

$$OUT = (A \cdot B \cdot C) + (D \cdot E \cdot F).$$

FIG. 4 illustrates yet another implementation of a compound domino logic for replacing conventional domino type circuits. The conventional domino logic circuit which operates in an equivalent logic manner is a six-input AND string with a single additional input connected in common to the circuit node. As noted above in connection with FIG. 2, the six-input AND string is reduced to two independently operated sections 96 and 98 driving respective preliminary output nodes 100 and 102. The conventional common node input is provided by input transistor 104 associated with input G, connected to a third preliminary output node 106. Node 106 is electrically independent from nodes 100 and 102. Charge sharing between the input transistors of sections 96 and 98 and that of transistor 104 is not degraded by the addition of input transistor 104. The static OR gate 108 is connected to preliminary output nodes 100 and 102 to provide the AND function with regard to inputs A-F. The output of the NOR gate 108 is connected to one input of a NAND gate 110, as is the preliminary output node 106. The output of the circuit of FIG. 4 is the result of a logical AND operation over inputs A-F ORed with the input G.

The compound domino logic circuit of FIG. 5 illustrates another important advantage of the invention. The use of this circuit presents a technical advantage in those instances where the complement of an input signal is available. In the noted circuit, inputs B-F are available as true logic signals, while the input A is available in its complement form. Hence, the complement of the signal A is applied to the output NOR gate 112. The circuit of FIG. 5 is similar to FIG. 2, but does not include an input transistor for the A digital signal, but rather applies the complement of the A signal to an additional input of the output NOR gate 112. Since the static logic gate 112 is a multiple input device, the necessity of an additional input is not unduly burdensome and does not require substantial wafer area. Since most logic circuits process the true signals, as well as the complement, the circuit of FIG. 5 can be very beneficial in that the input transistor count of domino circuits can be reduced, and thus the wafer area necessary for fabrication can also be reduced. The propogation delay of the circuit can also be reduced, in that the input signal is applied directly to the static output device and need not propogate through an input transistor. The elimination of an input transistor also reduces the charge sharing problem.

FIG. 6 is a compound domino logic circuit comprising a four-input AND structure with positive feedback to provide quasi-static operation. Input transistors 114 and 116, associated with inputs A and B, drive the preliminary output node 118. Input transistors 120 and 122, associated with inputs C and D, drive the preliminary output node 124. A feedback network 126 comprising a static inverter 128 driving a PMOS precharge transistor 130 is connected to the preliminary output node 124.

The feedback network 126 assures that the preliminary output node 124 remains at a static logic high level so that the precharged voltage thereat is not eventually discharged through the high resistance semiconductor substrate. The preliminary output node 124 is initially precharged to a logic high by the clocked PMOS precharge transistor 134. If one or both of the input transistors 120 or 122 is not driven into conduction by a corresponding input, the preliminary output node 124 should remain at a logic high. The precharged logic high at node 124 is applied to the input of the inverter 128, and inverted to a logic low which is applied to the gate of the precharge PMOS transistor 130. The precharge transistor 130 is thus driven into conduction, coupling the supply voltage Vdd back to the preliminary output node 124. Thus, for logic high levels, the preliminary output node 124 has been transformed from a dynamic node to a static node.

In the event that both input transistors 120 and 122 are driven into conduction by logic high signals applied to the respective C and D inputs thereof, the preliminary output node 124 will be driven to a logic low through such input transistors and the clocked ground reference transistor 132. The inverter 128 will drive the precharge transistor 130 with a logic high, thereby turning it off. As a result, the voltage supply Vdd is isolated from the preliminary output node 124 by the cut-off transistor 130. The technical advantage afforded this arrangement is that a static current drain through the circuit is prevented when the preliminary output node 124 is discharged to a logic low.

Of course, with a logic high applied to both inputs C and D, the state of the preliminary output node 124 is controlled by the state of the CLK. When the CLK signal is high, the PMOS precharge transistor 134 is cut off, and the preliminary output node 24 will be drawn to a logic low through input transistors 120 and 122 and the discharge transistor 132. When the CLK input is low, the precharge transistor 134 will be driven into conduction. Under these conditions, the preliminary output node will be precharged to a logic high level. The removal of the supply voltage from the preliminary output node 124 during logic low states is important so that a static current drain from the supply voltage Vdd to ground is eliminated. The feed back network 136 associated with preliminary output node 118 operates in a similar manner.

FIG. 7 illustrates a conventional CMOS domino circuit providing the logic function: $(A \cdot B)+(C \cdot D)+(E \cdot F)=OUT$. The circuit is characterized by a pair of input transistors 138 and 140 associated with inputs A and B, and connected through a discharge transistor 142 to ground. Another pair of input transistors 144 and 146 are connected through another discharge transistor 148 to ground. A third pair of input transistors 150 and 152 are connected through a third discharge transistor 154 to ground. The drain terminal of each input transistor 138, 144 and 150 is connected in common to an internal node 156. The current sharing problem of the circuit of FIG. 7 is apparent. Should input transistors A, C and E be driven into conduction, even though transistors B, D and F are cut off, the transient current charging the drain-source capacitance can decrease the precharged voltage at node 156 sufficiently to change the output state of the inverter 158. On the occurrence of this condition, the circuit operates erroneously, thus providing an output not satisfying the foregoing logic equation.

The compound domino logic circuit of FIG. 8 overcomes the charge sharing problem, and provides a technical advantage in that erroneous circuit operation due to charge sharing is substantially reduced. The compound domino logic circuit of the invention includes a pair of input transistors 160 and 162, each associated with a respective input A and B. A second pair of input transistors 164 and 166 are associated with respective inputs C and D. Lastly, a third pair of input transistors 168 and 170 are associated with a respective input E and F. The source terminals of input transistor 162, 166 and 170 are each connected to the drain terminal of a respective discharge transistor 172, 174 and 176. The drain terminal of input transistor 160 is connected to the source terminal of an associated PMOS precharge transistor 178. Input transistors 164 and 168 are comparably connected to respective PMOS precharge transistors 180 and 182. The provision of the three precharge transistors 178–182 enables each noted pair of input transistors to be connected to a respective preliminary output node 184, 186 and 188. A CLK input is connected to the gate terminal of each precharge transistor, as well as the gate terminal of each discharge transistor.

In order to produce an output in accordance with the equation noted with respect to the prior art circuit of FIG. 7, a three-input NAND gate 190 is connected to the three preliminary output nodes 184–188. The output of the static NAND gate 190 provides the output of the domino logic circuit. The three preliminary output nodes 184–188 are electrically isolated from each other, and are precharged by respective precharge transistors 178–182. As a result, the drain-source capacitances required to be charged are not only isolated, but also are provided with separate precharging sources, e.g., the precharge transistors 178–182. The provision of the NAND gate 190 connected to the three preliminary output nodes 184–188 preserves the operation in accordance with the noted equation, previously provided by the common node connection of the prior art circuit.

From the foregoing, a compound domino logic circuit is disclosed, and provides the technical advantages of reduced or eliminated erroneous circuit operation due to current sharing problems, higher speed circuit operation, and in some instances reduced wafer fabrication area. Current-sharing problems are reduced by providing plural stages of input transistors, each connected to an electrically isolated preliminary output node. Each preliminary output node is precharged by a separate precharge PMOS transistor. The output of the compound domino logic circuit of the invention comprises a static logic gate of such type as to provide a logic output corresponding to a counterpart prior art logic circuit. The compound domino logic circuit of the invention provides improved circuit speed, as the plural precharge transistors can charge the respective preliminary output nodes connected to a small number of input transistors faster than the single prior art precharge device can precharge a large number of input transistors. Circuit speed is also enhanced by providing a preliminary output node associated with each stage of input transistors, whereby the drain-source capacitances can be more quickly charged, and the logic state of the node can be more quickly established. Depending on the input signals available, and the logic to be performed, wafer area, propogation delay and charge sharing may be reduced by applying one or more input signals directly to the static gate.

While the preferred embodiment of the invention has been disclosed with reference to specific compound domino logic circuits, it is to be understood that many changes in detail may be made as a matter of engineering choices without departing from the spirit and scope of the invention, as defined by the appended claims.

What is claimed is:

1. A compound domino logic circuit for performing a logical AND operation over a plurality of logic input signals, said circuit comprising:

at least three sections of logic devices arranged in parallel, each section including a node for providing a preliminary output signal, the logic devices in each of a first and a second section coupled in series to gate current flow in response to one or more of the plurality of input signals and generate a preliminary output signal at the section node, the third section including at least one logic device positioned to gate current flow in response to at least one additional input signal and generate a preliminary output signal a the third section node;

gate means for selectively coupling each preliminary node to a voltage source and for electrically isolating the sections from one another;

discharge means for selectively coupling each section to a second voltage level;

clock means for controlling said gate means in order to precharge each section with the voltage source and for controlling said discharge means in order to provide preliminary output signals at the nodes;

means for performing a logical OR operation over preliminary output signals provided by the first and second sections, said OR means providing a secondary logic output signal; and means for performing a logical NAND operation over the secondary logic output signal and a preliminary output signal provided by the third precharged section.

2. The compound domino logic circuit of claim 1 wherein said gate means comprises a plurality of PMOS transistors.

3. The compound domino logic circuit of claim 1 wherein said discharge means comprises a plurality of NMOS transistors.

4. A method for performing a logical AND operation over a first group of logic input signals, the method comprising the steps of:

arranging in parallel electrical isolation at least first and second sections of logic devices between a supply voltage source and ground with the logic devices in each section coupled to selectively control current flow to ground in response to the first group of logic input signals so that each section provides an electrically isolated preliminary output signal;

arranging an additional section having at least one logic device between the supply voltage and ground and in electrical isolation from the other sections, said additional section coupled to selectively control flow to ground in response to the additional logic signal so that the additional section provides an additional electrically isolated preliminary output signal;

precharging each section in electrical isolation from each other section with a different clocked device positioned between each section and the voltage source in order to preset each preliminary output signal to preselected voltage;

controlling current flow to gorund by driving logic device gates in the first and second precharged sections with the first group of logic input signals;

controlling current flow to ground by driving at least one logic device gate in the additional section with the additional logic signal; and performing a logical OR operation over preliminary output signals provided by the first and second sections with a first static logic gate to generate an intermediate output 5 signal; and performing a logical NAND operation over the intermediate output signal and the additional preliminary output signal with a second static logic gate.

5. A compound domino logic circuit for performing a desired logic function over a plurality of logic input signals, said circuit comprising:

at least three sections of series connected logic devices arranged in parallel, each device responsive to a logic input signal, each section including a node for producing a preliminary output signal;

gate means for selectively coupling each node to a voltage source and for electrically isolating the sections from one another;

discharge means for selectively coupling each section to a second voltage level;

clock means for controlling said gate means in order to precharge each section with the voltage source and for controlling said discharge means in order to provide preliminary output signals at the nodes;

static logic means for performing a logic OR operation over preliminary output signals provided by two of said at least three sections, said OR means providing a secondary logic output signal; and means for performing a logical NAND operation over the secondary logic output signal and a preliminary output signal provided by the third of said at least three precharged sections.

6. A method for performing a logical AND operation over N input signals with a compound domino logic circuit comprising multiple prechargeable sections of logic devices, the sections arranged in parallel between a supply voltage source and ground, the logic devices in each section coupled to gate current flow through a section in response to one or more input signals to produce an electrically isolated preliminary output signal from each section, each preliminary output signal coupled to a logic gate, the method comprising the steps of:

precharging each of said prechargeable sections to a predetermined voltage level with a different clocked precharge transistor;

providing input signals to logic device in the precharged sections; and

ORing the preliminary output signal of all but one of said precharged section through the logic gate to provide a secondary logic output signal; and performing a logical NAND operation over the secondary logic output signal and the remaining one preliminary output signal.

7. The method of claim 5 wherein at least one discharge transistor is positioned to selectively couple each precharged section to ground and the step of precharging each section is performed by inputting one or more clock signals to the gates of the precharge transistors and the discharge transistor to prevent current flow to ground while the precharge transistors conduct current into the sections.

8. The method of claim 7 further comprising the step of turing off the precharge transistors and driving the discharge transistor into conduction after each section is precharged so that when the input signals drive all of the logic devices in a section into conduction current may flow to ground thereby altering the voltage of the preliminary logic output signal for that section.

* * * * *